United States Patent [19]

Wendell

[11] Patent Number: 5,122,681

[45] Date of Patent: Jun. 16, 1992

[54] SYNCHRONOUS BICMOS LOGIC GATE

[75] Inventor: Dennis L. Wendell, Pleasanton, Calif.

[73] Assignee: National Semiconductor Corporation, Santa Clara, Calif.

[21] Appl. No.: 669,712

[22] Filed: Mar. 15, 1991

[51] Int. Cl.⁵ .......................................... H03K 19/003
[52] U.S. Cl. .................................... 307/446; 307/443; 307/480
[58] Field of Search ............... 307/443, 446, 452, 480, 307/481, 594, 597

[56] References Cited

U.S. PATENT DOCUMENTS

| | | | |
|---|---|---|---|
| 4,810,902 | 3/1989 | Storti et al. | 307/446 |
| 4,845,386 | 7/1989 | Ueno | 307/446 |
| 4,999,519 | 3/1991 | Kitsukawa et al. | 307/443 |
| 4,999,520 | 3/1991 | Usami et al. | 307/443 X |
| 5,038,191 | 8/1991 | Hasegawa et al. | 307/446 X |
| 5,049,765 | 9/1991 | Young et al. | 307/446 |

Primary Examiner—David Hudspeth
Attorney, Agent, or Firm—Irving S. Rappaport; Robert C. Colwell; Gary T. Aka

[57] ABSTRACT

A synchronous BiCMOS logic circuit which operates between two voltage supplies and has at least one input terminal, an intermediate node and an output terminal is disclosed. The logic circuit is capable of a high speed transition in response to a signal pulse from a first logic state to a second logic state at the input terminal. The logic circuit has at least one MOS input transistor of a first polarity having a gate electrode connected to the input terminal. The MOS input transistor is coupled between the first voltage supply and the output node by its source/drain electrodes. A first current supply connected to the output node to the second voltage supply and weakly holds the intermediate node low when the logic circuit is in an initial state with the MOS input transistor turned off.

16 Claims, 2 Drawing Sheets

SYNCHRONOUS BICMOS LOGIC GATE

BACKGROUND OF THE INVENTION

The present invention relates to BiCMOS integrated circuit devices and, in particular, to high-speed BiCMOS logic circuits useful in integrated circuits.

BiCMOS integrated circuits are semiconductor devices in which bipolar technology is combined with complementary metal oxide semiconductor (CMOS) technology. In such an BiCMOS integrated circuit, the higher speed bipolar transistors or transistor circuits are located at the suitable locations in the semiconductor device to use the speed and drive capabilities inherent in bipolar transistors. The CMOS circuits are typically used wherever higher packing densities and lower power consumption of CMOS circuits are suitable, though a bipolar transistor may occupy less area for the same effective current drive.

Typically for any logic circuit, the gate delay is a desired operational parameter characterized by the time at which a logic circuit switches from one logic state to a second state and from the second state to the first. On the other hand, a typical result of high switching speeds is increased power consumption by the logic circuit, which is not desireable. With BiCMOS circuits, though, less power is consumed than with other types of circuits for the same fanout performance.

In most applications of logic circuits, the circuit is required to switch at high speeds in both directions. After a switch from an original logic state to a second logic state, the switch back into the original logic state occurs at the same rate at some later time. In response to these switching requirements, the present invention provides for a BiCMOS logic circuit which is able to switch very quickly, i.e., with small propagation delays, from a first logic state to a second logic state in response to an input signal pulse. The switch back from the second logic state to the first logic state occurs at the same rate but delayed in response to a reset signal pulse timed by a clock signal, or self-timed, from the input signal pulse. In other words, a circuit is used to reset the logic circuit synchronously. Power is saved because a relative high current flows only to switch the logic circuit in the desired direction.

SUMMARY OF THE INVENTION

Thus the present invention provides for a BiCMOS logic circuit which operates between two voltage supplies and has at least one input terminal, an output node and an output terminal. The logic circuit is capable of a high-speed transition in response to a signal pulse from a first logic state to a second logic state at the input terminal.

The logic circuit has at least one MOS input transistor of a first polarity having a gate electrode connected to the input terminal. The MOS input transistor is coupled between the first voltage supply and the intermediate node by its source/drain electrodes. A first current supply connects the output node to the second voltage supply to weakly hold the intermediate node low.

A bipolar transistor also has its base electrode connected to the intermediate output node. The bipolar transistor also has a collector electrode connected to the first voltage supply and an emitter electrode connected to said output terminal. A second current supply also connects the emitter electrode to the second voltage supply and weakly holds the emitter electrode low when the logic circuit is in its initial state.

From a quiescent first state, the logic circuit switches at high speed when the input signal pulse turns the MOS input transistor on and the bipolar transistor is, in turn, turned on.

To reset the BiCMOS logic circuit, the circuit has two MOS transistors, one connected between the intermediate node and the second voltage supply and the other between the output electrode and the second voltage supply. A circuit connected to the gate electrodes of these transistors is responsive to a clock signal, for resetting the BiCMOS logic circuit after a predetermined time delay. Since a logic circuit typically is in a chain of logic circuit stages, the reset of the logic circuit stage is timed to occur later than the reset of the previous logic circuit stage, i.e., after the input signal pulse has passed. This prevents a conflict between the logic state of the previous stage and the logic state of the reset stage. Hence the delay must be timed in a predetermined manner.

BRIEF DESCRIPTION OF THE DRAWINGS

A clear understanding of the present invention may be achieved by a perusal of the following Description of Preferred Embodiments and the following drawings.

DESCRIPTION OF PREFERRED EMBODIMENTS

Figure 1:
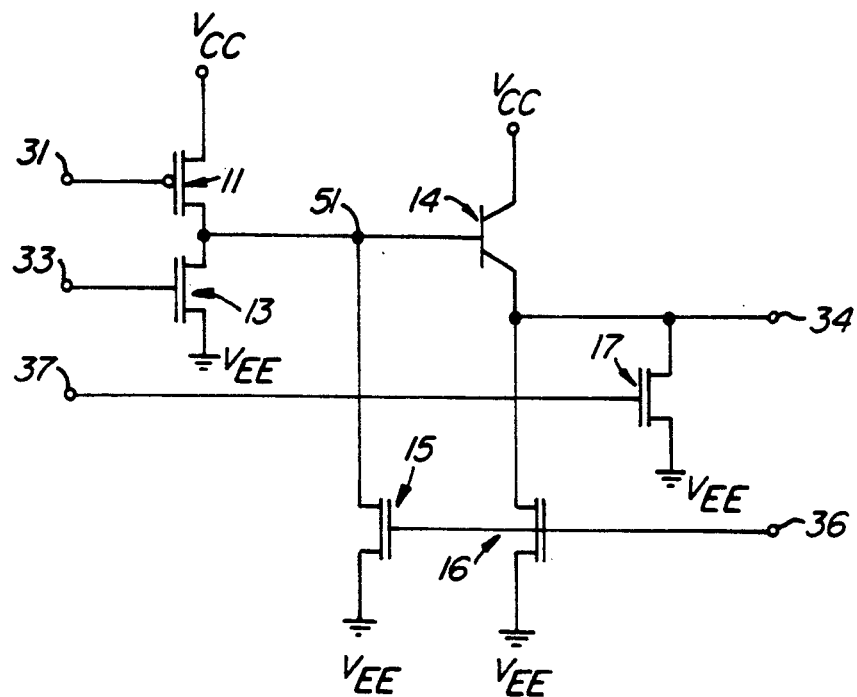
FIG. 1 is a schematic diagram of an inverter circuit according to the present invention.

FIG. 1 illustrates a simple form of the present invention, an inverter circuit. The FIG. 1 circuit has an input terminal 31 which is connected to the gate electrode of a PMOS input transistor 11. In passing, it should be noted that in the drawings herein a bubble on the gate of a MOS transistor indicates a PMOS transistor.

The source electrode of the transistor 11 is connected to a voltage supply terminal at VCC, while the drain electrode of the transistor 11 is connected to an intermediate node 51. Also connected to the intermediate node 51 is the drain electrode of an NMOS transistor 13, which has its source electrode connected to a second voltage supply terminal at VEE. The gate electrode of the transistor 13 is connected to a terminal 33 which is held at a first reference voltage at 1.3 volts above $V_{EE}$.

The intermediate node 51 is also connected to a base electrode of an NPN bipolar transistor 14. The bipolar transistor 14 has a collector electrode connected to a voltage supply terminal at $V_{CC}$ and an emitter electrode connected to an output terminal 34. The emitter electrode of the transistor 14 is also coupled to the second voltage supply at $V_{EE}$ by a NMOS transistor 17 which has its source electrode connected to a terminal at the $V_{EE}$ voltage reference and a drain electrode connected to the emitter electrode of the bipolar transistor 14. The gate electrode of the transistor 17 is connected to a terminal 37 which is connected to a second reference voltage at 1.2 volts above $V_{EE}$. It should be noted that this reference voltage may be anywhere between $V_{CC}$ and $V_{EE}$ depending upon size and bias conditions desired for the transistor 17.

The intermediate node 51 is additionally connected to the drain electrode of an NMOS transistor 15 which has its source electrode connected to the second voltage supply at $V_{EE}$. The emitter electrode of the NPN transistor 14 is also connected to the drain electrode of an NMOS transistor 16 which has its source electrode connected to the second voltage supply at $V_{EE}$. The gate electrode of both transistors 15 and 16 are connected to a control signal terminal 36 which is connected to a circuit which generates a reset signal for the FIG. 1 circuit.

Transistors 13 and 17 are small current sources, which maintain the voltage levels of the logic circuit when it is in the quiescent state. In the initial state of the inverter circuit with the logic state high at the input terminal 31, the MOS input transistor 11 is off. The reference voltage at the terminal 33, approximately 1.3 volts above $V_{EE}$ is such that the transistor 13 weakly holds the output node 51 to the $V_{CC}$ supply voltage, i.e., the node 51 is held low when the MOS input transistor 11 is off. Likewise, when the PMOS transistor 11 is off (the signal at the input terminal 31 is high), the output terminal 34 is held low weakly by the transistor 17 by the reference voltage at the terminal 37 (approximately 1.2 volts above $V_{EE}$). Thus the transistors 13 and 17 are small compared to the size of the transistor 11 (even accounting for the fact that the transistor 11 is a PMOS device) and to the bipolar transistor 14 (from a current capacity viewpoint).

Operationally, the inverter circuit of FIG. 1 starts in a quiescent state with the voltage at the input terminal 31 high. The inverter circuit switches with an input signal pulse at the terminal 31 from a high voltage level to a low voltage level and back to a high level. The output signal at the terminal 34 correspondingly switches at a very high speed from a low voltage level to a high voltage level. With reset circuitry described below, the inverter circuit quickly returns to the quiescent state after the negative-going pulse has passed through the input terminal 31.

If the high voltage level is termed the high logic state and the low voltage level the low logic state, then the signal at the output terminal 34 switches from a low logic state to a high logic state at high speeds when the signal at the input terminal 31 switches from a high logic state to a low logic state. When the pulse passes through the input terminal 31, the output terminal 34 quickly switches back to the low logic state.

At the negative-going edge of the input signal pulse at the terminal 31, the PMOS transistor 11 is turned on and the transistor 11 quickly pulls the intermediate node 51 high. Current flows from the first voltage supply at $V_{CC}$ through the transistor 11 into the base region of the NPN transistor 14. The NPN transistor 14 is turned on and the emitter electrode of the transistor goes high in voltage. The inverter circuit has been set.

The FIG. 1 circuit is set with respect to the input signal pulse which is timed with respect to a clock signal. Since the FIG. 1 circuit is likely to be one stage in a chain of logic circuit stages, the reset signal pulse must also be timed. The reset signal pulse occurs after the previous stage, which had set the FIG. 1 circuit, is reset itself, i.e., the positive-going edge of the input signal pulse to the FIG. 1 circuit has passed the input terminal 31.

Figure 4A:
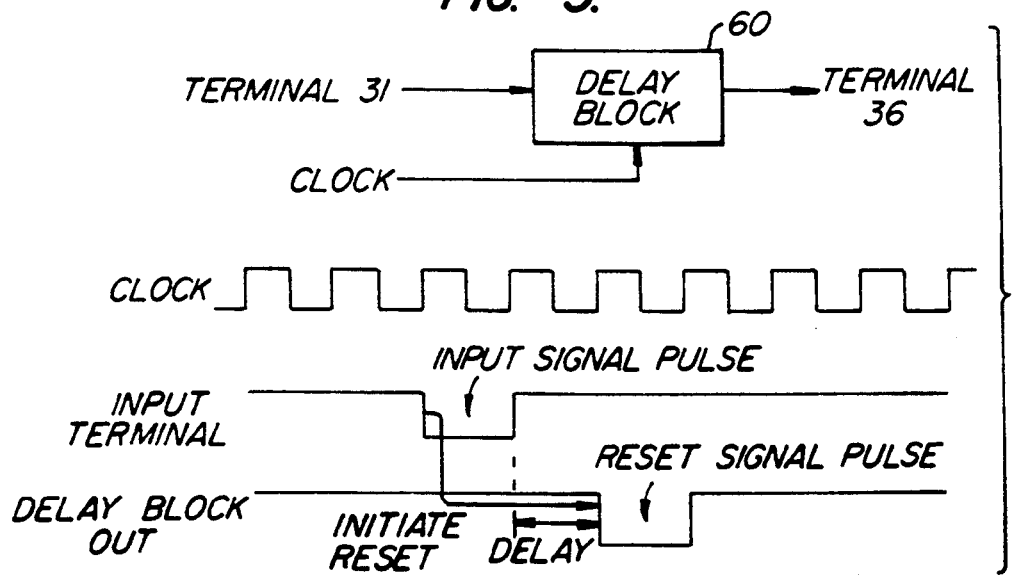
FIGS. 4A and 4B are different embodiments of a reset circuit for the circuits of FIGS. 1-3.

FIG. 4A is a block diagram of one embodiment of a reset circuit. The input terminal of a delay block 60 is connected to the terminal 31. After receiving the negative edge of the input signal pulse, the block 60, which is timed by the clock signal, issues a positive pulse a predetermined amount of time later. This positive pulse then appears at the reset terminal 36.

Responsive to the high voltage on the terminal 36, the NMOS transistors 15 and 16 reset the nodes 51 and 54 simultaneously with, in the ideal case, or shortly after, in the more likely case, the signal pulse at the input terminal 31 returns to a high state to turn off the MOS input transistor 11. The transistors 15 and 16 are turned on and the intermediate node 51 and the output terminal 34 are pulled low and the FIG. 1 inverter is reset to the initial quiescent state.

Then the signal pulse at the terminal 36 travels low and the transistors 15 and 16 are turned off. The output node 51 and the output terminal 34 remain low due to the action of the weak coupling action of the transistors 13 and 17 respectively to the $V_{EE}$ voltage supply. Thus the inverter circuit is reset synchronously with the clock signal.

Figure 4B:
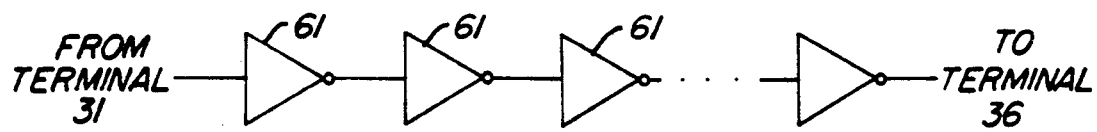

FIG. 4B is another embodiment of the reset circuit which is self-timed with respect to the input signal pulse. The reset circuit of FIG. 4B uses a delay line formed by serially-connected inverters 61. The delay line of the plurality of inverters 61 receives the signal from the input terminal 31 of the FIG. 1 circuit as an input signal. As is well-known to those skilled in circuit design, the length of delay can be determined by selecting an output terminal of a particular inverter in the chain of inverters as the delayed signal. Thus the delayed signal is self-timed with respect to the signal pulse at the input terminal 31. The delayed signal pulse is then sent back to the gate electrodes of the transistors 15 and 16 through the terminal 36.

Figure 2:
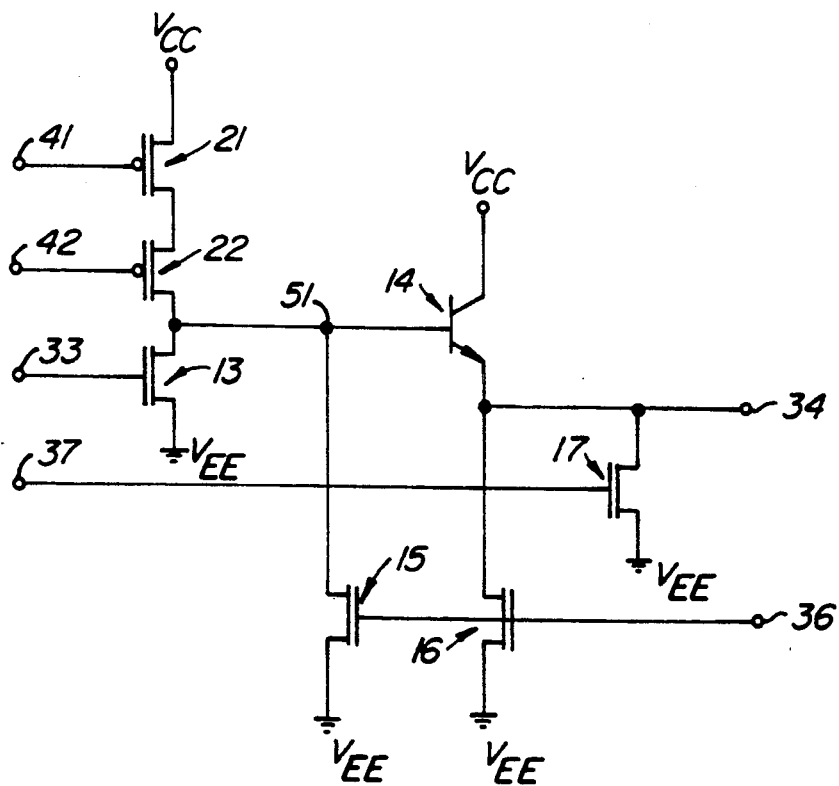
FIG. 2 is a schematic diagram of a NAND logic circuit according to the present invention.

FIG. 2 illustrates a two-input NAND logic gate according to the present invention. Except for the PMOS transistors 21 and 22, and the input terminals 41 and 42, the same reference numerals are used in FIG. 2 as in FIG. 1.

In the FIG. 2 circuit, the generalized MOS input transistors with their source/drain electrodes which couple the first voltage supply to the output node are realized by two PMOS transistors 21 and 22 which are connected in series between the output node 51 and the $V_{CC}$ voltage supply. The source electrode of the PMOS transistor 21 is connected to the first voltage supply at $V_{CC}$. The drain electrode of the transistor 21 and the source electrode of the transistor 22 are connected together, while the drain electrode of the transistor 22 is connected to an output node 51. The gate electrodes of each of the transistors 21 and 22 are respectively connected to two input terminals 41 and 42.

As described previously, the output node 51 is also connected to the drain electrode of an NMOS transistor 13 which has its source electrode connected to the second voltage supply at $V_{EE}$. Also connected to the output node 51 is the base electrode of an NPN transistor 14 which has a collector electrode connected to the first voltage supply at $V_{CC}$ and another electrode connected through an output node 54 to an output terminal 34. The output node 54 is also connected to the drain electrode of an NMOS transistor 15 which has its source electrode connected the first voltage supply at $V_{EE}$ and its gate electrode connected to a terminal 37 at a second voltage reference.

Two NMOS transistors 15 and 16 respectively have their drain electrodes connected to the output node 51 and the output terminal 34. The source electrodes of these transistors 15 and 16 are connected to the second voltage supply and their gate electrodes are connected to a terminal 36.

The FIG. 2 circuit operates in the same general manner as the inverter circuit of FIG. 1. In the initial quiescent state of the FIG. 2 circuit, the signals at both input terminals 41 and 42 are high and the signal at the output terminal 34 is low. The circuit switches when both input signal pulses at the terminals 41 and 42 go low to turn on both PMOS transistors 21 and 22. Otherwise, the signal at the output terminal 34 remains low. Thus, the FIG. 2 circuit operates as a NAND logic circuit.

It should be noted that the reset circuits of FIGS. 4A and 4B may easily be modified to account for the two input signals for the NAND logic circuit of FIG. 2.

Figure 3:
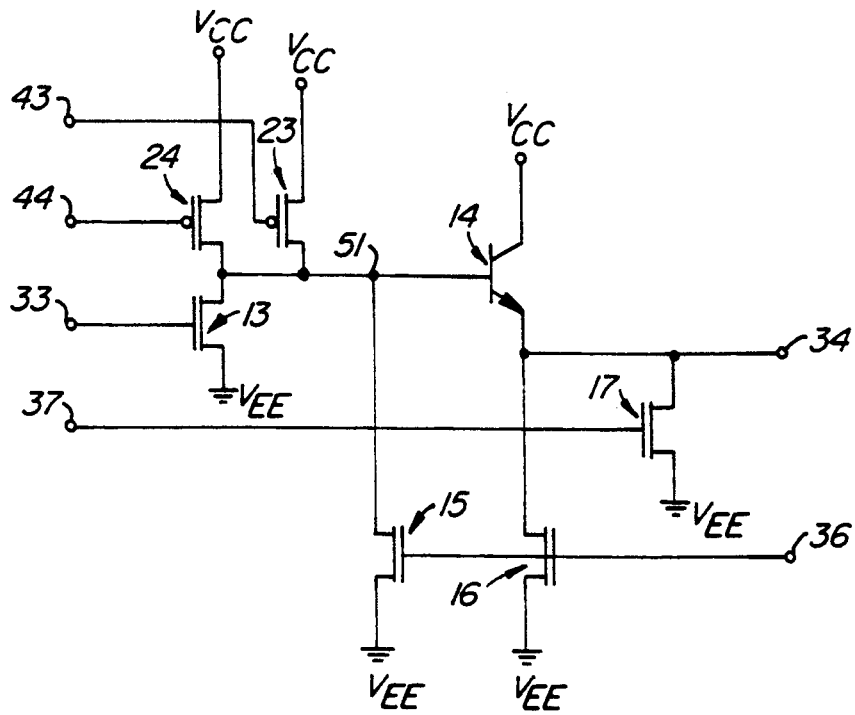
FIG. 3 is a schematic diagram of a NOR logic circuit according to the present invention.

FIG. 3 is another variation of the present invention and operates as a two-input NOR circuit. In FIG. 3 the same reference numerals are used in the circuit as that in FIG. 1 except for the PMOS input transistors 23 and 24, and the input terminals 43 and 44. In FIG. 3 the MOS input transistors which couple the first voltage supply to the output node 51 through their source/drain electrodes are realized by the parallel-connected transistors 23 and 24. The source electrodes of both PMOS transistors 23 and 24 are connected to the first voltage supply at $V_{CC}$ and the drain electrode of the transistor 23 and 24 are connected to the output node 51. The gate electrodes of each of the transistors 23 and 24 are respectively connected to two input terminals 43 and 44.

As described previously, the intermediate node 51 is also connected to the drain electrode of the NMOS transistor 13 which has its source electrode connected to the second voltage supply at $V_{EE}$. Also connected to the output node 51 is the base electrode of the NPN transistor 14 which has a collector electrode connected to the first voltage supply at $V_{CC}$ and an emitter electrode connected to the output terminal 34. The output terminal 34 is also connected to the drain electrode of the NMOS transistor 15 which has its source electrode connected the first voltage supply at $V_{EE}$ and its gate electrode connected to the terminal 37 at a second voltage reference.

The two NMOS transistors 15 and 16 respectively have their drain electrodes connected to the output node 51 and the output terminal 34. The source electrodes of these transistors 15 and 16 are connected to the second voltage supply and their gate electrodes are connected to a terminal 36.

The FIG. 3 circuit operates in the same general manner as the inverter circuit of FIG. 1 and NAND logic circuit of FIG. 2. The initial quiescent state of the FIG. 3 circuit has the signals at both input terminals 43 and 44 high and the signal at the output terminal 34 is low. The circuit switches when one or both input signal pulses at the terminals 42 and 44 go high to turn on either or both PMOS transistors 23 and 24. Otherwise, the signal at the output terminal 34 remains low. Thus, the FIG. 3 circuit operates as a NOR logic circuit. The reset circuits of FIGS. 4A and 4B may be modified to operate with the FIG. 3 circuit.

The present invention has proved effective in practice. In BiCMOS integrated circuits having process parameters of 1.0 micron linewidths, and MOS channel lengths of 0.9 microns, the BiCMOS logic circuits according to the present invention have operated at high switching speeds. For example, an inverter has been found to switch in 250 picoseconds compared to 500 picoseconds for standard BiCMOS asynchronous logic gates.

While the above is a complete description of the preferred embodiments of the invention, various alternatives, modifications and equivalents may be used. For example, the present invention has been described in the context of one- and two-input BiCMOS logic circuits. It should be evident that the present invention is equally applicable to three- or more input BiCMOS logic circuits by making appropriate modifications. Furthermore, the circuit described herein may be modified by reversing the polarities of transistors of the circuit, along with the polarities of the voltage references, without departing from the present invention. Therefore, the above description should not be taken as limiting the scope of the invention which is defined by the appended claims.

What is claimed is:

1. A BiCMOS logic circuit having at least one input terminal, an intermediate node and an output terminal, and operating between a first and second voltage supply, said logic circuit comprising:

a first MOS input transistor of a first polarity, said MOS input transistor having a gate electrode connected to said input terminal, and having first and second source/drain electrodes, said MOS input transistor coupled between said first voltage supply and said intermediate node by said first and second source/drain electrodes;

a first current supply having a first electrode connected to said intermediate node and a second electrode connected to said second voltage supply;

a bipolar transistor having a collector electrode connected to said first voltage supply, a base electrode connected to said intermediate node, and an emitter electrode connected to said output terminal; and a second current supply having a first electrode connected to said emitter electrode and a second electrode connected to said second voltage supply;

whereby said output terminal switches from a first output logic state to a second output logic state responsive to a input signal pulse from said first logic state to said second logic state at said input terminal.

2. The BiCMOS logic circuit as in claim 1 further comprising means connected to said emitter electrode and said base electrode for coupling said emitter electrode and said base electrode to said second voltage supply responsive to a reset signal delayed a predetermined amount after said input signal pulse at said input terminal.

3. The BiCMOS logic circuit as in claim 2 wherein said coupling means comprises a first MOS transistor of second polarity, said transistor having a source electrode connected to said second voltage supply, a gate electrode connected to a terminal for receiving said reset signal, and a drain electrode connected to said emitter electrode.

4. The BiCMOS logic circuit as in claim 3 wherein said coupling means further comprises a second MOS transistor of second polarity, said transistor having a source electrode connected to said second voltage supply, a gate electrode connected to said reset signal receiving terminal and a drain electrode connected to said output node.

5. The BiCMOS logic circuit as in claim 1 wherein said first current supply comprises a third MOS transistor of a second polarity having a source electrode connected to a second voltage supply, a drain electrode connected to said output node, and a gate electrode connected to a first voltage reference such that said output node is weakly coupled to said second voltage supply.

6. The BiCMOS logic circuit as in claim 1 wherein said second current supply comprises a fourth MOS transistor of said second polarity having a source electrode connected to said second voltage supply, a drain electrode connected to said emitter electrode, and a gate electrode connected to a second voltage reference such that said emitter electrode is weakly coupled to said second voltage supply.

7. The BiCMOS logic circuit as in claim 6 wherein a MOS transistor of said first polarity is a PMOS transistor and a MOS transistor of said second polarity is a NMOS transistor.

8. The BiCMOS logic circuit as in claim 7 wherein said bipolar transistor comprises a NPN transistor.

9. The BiCMOS logic circuit as in claim 1 further comprising a second MOS input transistor and a second input terminal, said second MOS input transistor having a gate electrode connected to said second input terminal, and having first and second source/drain electrodes, said second MOS input transistor coupled in series with said first MOS input transistor between said first voltage supply and said intermediate node by said first and second source/drain electrodes whereby a NAND logic gate is formed.

10. The BiCMOS logic circuit as in claim 1 further comprising a second MOS input transistor and a second input terminal, said second MOS input transistor having a gate electrode connected to said second input terminal, and having first and second source/drain electrodes, said second MOS input transistor coupled in parallel with said first MOS input transistor between said first voltage supply and said intermediate node by said first and second source/drain electrodes whereby a NOR logic gate is formed.

11. The BiCMOS logic circuit as in claim 2 further comprising a reset circuit for generating said reset signal pulse a predetermined amount after a forward edge of said input signal pulse.

12. The BiCMOS logic circuit as in claim 11 wherein said predetermined amount is timed by a clock signal.

13. The BiCMOS logic circuit as in claim 11 wherein said predetermined amount is self-timed by a delay line of said input signal pulse.

14. In a BiCMOS logic circuit having a first MOS transistor of a first polarity, said MOS input transistor having a gate electrode connected to an input terminal, and having first and second source/drain electrodes, said MOS transistor coupled between a first voltage supply and an intermediate node by said first and second source/drain electrodes; a first current supply having a first electrode connected to said intermediate node and a second electrode connected to a second voltage supply; a bipolar transistor having a collector electrode connected to said first voltage supply, a base electrode connected to said intermediate node, and an emitter electrode connected to an output terminal; a second current supply having a first electrode connected to said emitter electrode and a second electrode connected to said second voltage supply; a first MOS transistor of second polarity, said transistor having a source electrode connected to said second voltage supply, a gate electrode connected to a control terminal, and a drain electrode connected to said emitter electrode; and a second MOS transistor of second polarity, said transistor having a source electrode connected to said second voltage supply, a gate electrode connected to said control terminal and a drain electrode connected to said output node; a method of performing high-speed logic switching comprising providing an input signal pulse from a first logic state to a second logic state at said input terminal to turn on said first MOS transistor and said bipolar transistor; and providing a reset signal pulse at said control terminal a predetermined amount after said input signal pulse at said input terminal for turning on said first and second MOS transistors of second polarity 15. The method as in claim 14 wherein said reset signal pulse providing step comprises timing said predetermined amount from a forward edge of said input signal pulse by a clock signal.

16. The method as in claim 14 wherein said reset signal pulse providing step comprises timing said predetermined amount from a forward edge of said input signal pulse by a delay line of said input signal pulse.

* * * * *